United States Patent
Posa

(10) Patent No.: US 6,220,955 B1
(45) Date of Patent: Apr. 24, 2001

(54) COMBINATION POWER AND COOLING CABLE

(76) Inventor: John G. Posa, 1204 Harbrooke Ave., Ann Arbor, MI (US) 48103

( * ) Notice: Subject to any disclaimer, the term of this patent is extended or adjusted under 35 U.S.C. 154(b) by 0 days.

(21) Appl. No.: 09/251,513

(22) Filed: Feb. 17, 1999

Related U.S. Application Data

(60) Provisional application No. 60/074,985, filed on Feb. 17, 1998.

(51) Int. Cl.[7] .................................................. H05K 5/00
(52) U.S. Cl. ........................... 454/184; 454/337; 62/396
(58) Field of Search ................................ 454/184, 337; 62/389, 390, 396

(56) References Cited

U.S. PATENT DOCUMENTS

| Re. 30,536 | * | 3/1981 | Perdreaux | 433/86 |
|---|---|---|---|---|
| 4,032,803 | * | 6/1977 | Durr et al. | 310/8.1 |
| 4,356,971 | * | 11/1982 | Ashman | 239/84 |
| 4,733,660 | * | 3/1988 | Itzkan | 128/303.1 |
| 5,074,861 | * | 12/1991 | Schneider et al. | 606/17 |
| 5,401,171 | * | 3/1995 | Paghdiwala | 433/215 |
| 5,873,259 | * | 2/1999 | Spillman | 62/396 |
| 5,892,199 | * | 4/1999 | Ahmed et al. | 219/137 R |

* cited by examiner

*Primary Examiner*—Pamela Wilson
(74) *Attorney, Agent, or Firm*—Gifford, Krass, Groh, Sprinkle, Anderson & Citkowski, PC

(57) ABSTRACT

Electrical power is delivered to a remote unit, the invention adds a second, hollow conduit to carry a cooling fluid. The conduit is preferably a tube used to used to carry air, and may either surround the power or signal cables, or may be supported parallel to the cabling in co-extensive fashion. The base unit to which the remote unit is attached may take any form, including a computer or other type of more sophisticated electronic apparatus. Alternatively, the remote unit may connect to a power box including batteries or an AC adapter in the event that only electrical power and not electrical signaling is involved. The device used to move the fluid is preferably in the form of a quiet, inexpensive air compressor or fan, perhaps including provisions to make it smaller, quieter or more efficient.

42 Claims, 2 Drawing Sheets

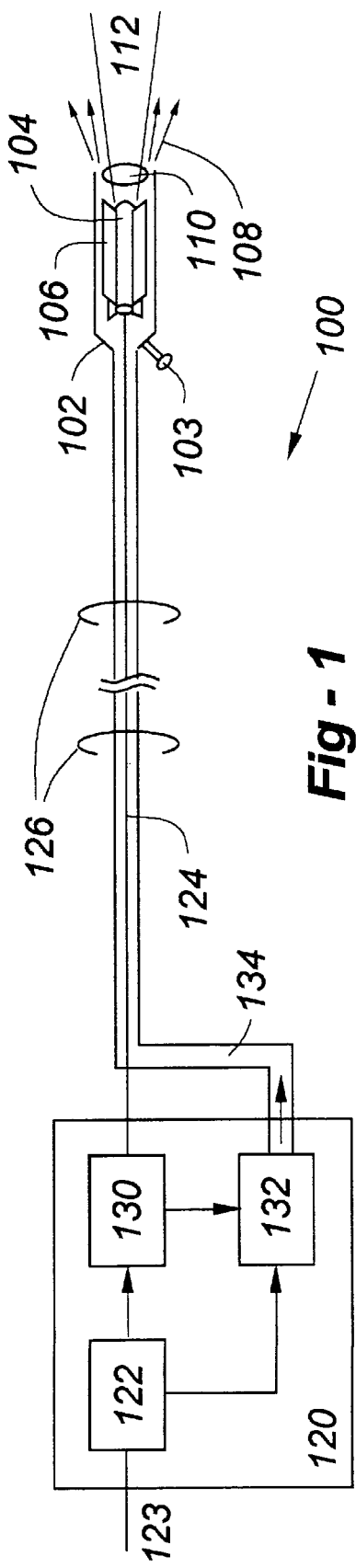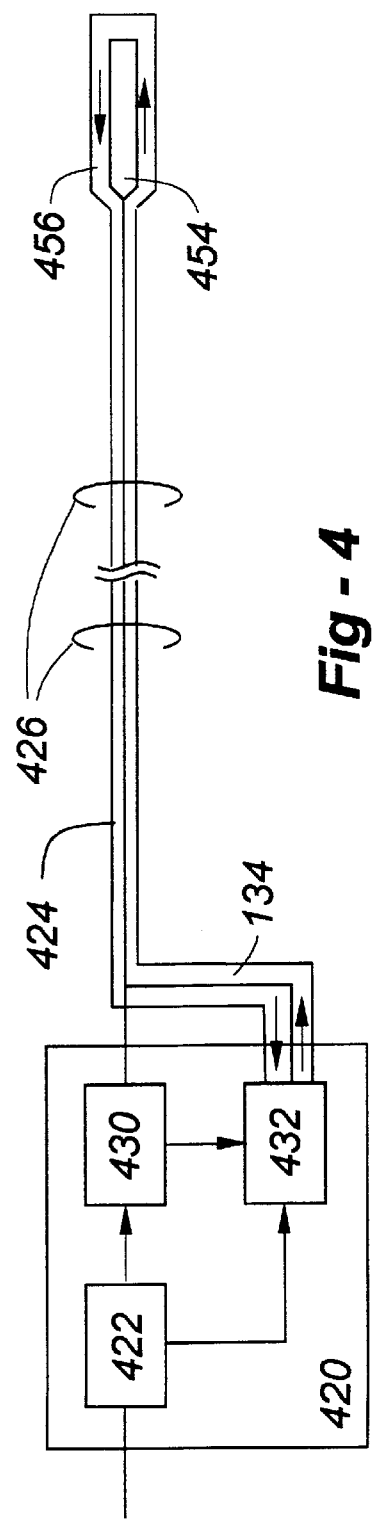

COMBINATION POWER AND COOLING CABLE

REFERENCE TO RELATED APPLICATION

This application claims priority of U.S. provisional application Serial No. 60/074,985, filed Feb. 17, 1998, the entire contents of which are incorporated herein by reference.

FIELD OF THE INVENTION

This invention relates generally to power delivery to electrical apparatus and, in particular, to an arrangement wherein power and cooling air are both carried to a utilization device along substantially the same cabling.

BACKGROUND OF THE INVENTION

There are many electrical appliances which could benefit from active as opposed to passive cooling but are either too small, or must remain too quiet, to incorporate an integral cooling fan. One example is the head-mounted high-intensity lamps currently used by surgeons and other medical/dental practitioners. Such assemblies, as the one depicted in U.S. Pat. No. 5,440,462, rely on a rather sophisticated housing to dissipate heat, since the incorporation of a fan would dramatically increase the weight of the lamp assembly, and might create noise that could distract the wearer.

Other examples of apparatus which could benefit from active cooling, but currently rely on passive heat dissipation due to size or noise requirements, include hand-held devices such as manual input devices for computers and hand-held telecommunications devices such as cellular telephones. In the case of the former, Microsoft Corporation of Bellevue, Wash. recently introduced a force-feedback joystick which includes its own processor and motors which need to be cooled. In this case, Microsoft incorporated a fan into the base of the unit, but users have found that the noise generated is unacceptable, in that it interferes with the quiet environment used to interact with the applications for which the device was intended.

In the case of cellular phones, users have found that through prolonged use, as in a vehicle, the unit becomes quite hot, often to an unacceptable degree. The heat generated by such phones conducts through plastic housing of the unit, which results in an unpleasant warming against the user's ear. As in the case of head-mounted medical/dental lighting, the interior of modern cellular phone packaging does not permit the integration of a cooling fan, which would also add weight and potentially introduce acoustic, if not electrical, noise.

In all of the cases just described, and there are others which will become obvious through the disclosure herein, a cable is already present to deliver power or to communicate other signals to the utilization device. In the case of the head-mounted medical/dental high-intensity light, a power cable runs either from a wall-mounted power supply or from the user's belt to provide electrical power to the lamp itself, which is typically halogen. In the case of the joystick, or other applications of this type, cabling must be provided from the base of the device to the computer not only for power, for also for signal communication. As for cellular telephones, although they may be used with internal batteries in a non-tethered state, when used in an automobile, often a power/charging cable is provided, which is the environment wherein such devices experience their prolonged use, leading to over-warming.

SUMMARY OF THE INVENTION

This invention is directed toward the cooling of utilization devices which could benefit from active as opposed to passive cooling but wherein integrated fans cannot, or should not, be included for reasons of size, weight or acoustic or electrical noise that might be generated. Broadly, where some form of electrical cabling must be brought to the utilization device already to deliver power or communicate information, the invention adds a second, hollow conduit to this cabling and means for introducing air into the end of the cabling remote from the utilization device, thereby delivering cooling air to the device without it, itself, having to incorporate a fan, for example.

The tubing used to carry the cooling air may either surround the power or signal cables in the form of a surrounding jacket, so that the resulting combined cable is substantially circular in cross-section or, alternatively, the cooling tube may be disposed next to the power or signal-carrying cables, resulting in an additional parallel path between the source of power or signals and the utilization device. Also, the "power" aspect of the inventive cable may be optical as opposed to electrical, as in the case of fibers carrying high-intensity light.

The equipment to which the utilization device is attached may take any form, including a computer or other type of more sophisticated electronic apparatus, or the utilization device may connect to a power box including batteries or an AC adapter in the event that only electrical power and not electrical signaling is involved.

In any case, the equipment to which the utilization device is attached includes means for introducing air into the air-carrying conduit, preferably in the form of a quiet, inexpensive air compressor, such as the type currently used in home aquariums. Such a unit would be optimized according to the invention, however, to make it smaller, quieter or more efficient. As an alternative to an air compressor, a fan such as a miniature squirrel-case fan may be used, or other suitable alternative such that a flow of air is received by the utilization device suitable for at least partial cooling thereof.

BRIEF DESCRIPTION OF THE DRAWINGS

FIG. 1 illustrates, in simplified form, a version of the invention adapted for use with a head-mounted medical/dental high-intensity lamp assembly;

FIG. 4 is a drawing which shows how a recirculating fluid may be used instead of a gas such as air according to the invention.

DETAILED DESCRIPTION OF THE INVENTION

Figure 2:
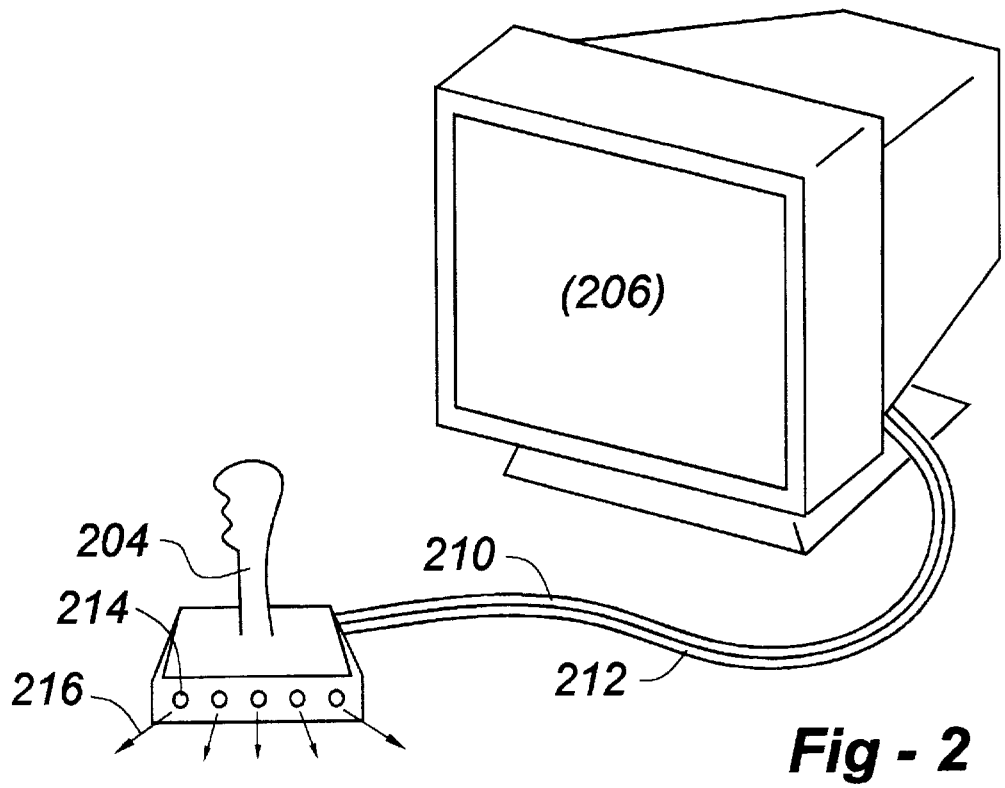
FIG. 2 illustrates an embodiment of the invention configured for use with a computer peripheral device.

In existing head-mounted high-intensity medical/dental lighting assemblies such as that depicted in U.S. Pat. No. 5,440,462, a sophisticated housing incorporating perforations, baffling and heat fins must be used to passively cool the assembly, particularly since it is used right next to the forehead of a wearer.

As shown in FIG. 1 of the instant invention, many of these packaging intricacies may be eliminated through the use of the invention, wherein a source of cooing air 132 is provided in conjunction with a source of power 122, and both are delivered to the lighting assembly, with the cooling air being used in conjunction with a much simpler assembly. The conduit 126 used to carry the air 134 from the compressor may either surround the power cables 124 in the form of a jacket, as shown, using fins to keep the walls spaced apart, as shown, or alternatively, as discussed below, the electrical and air tubes may be placed side-by-side. Power may come directly from source 122, as in the case of batteries, or 122 may represent some sort of power converter, with power instead being delivered along line 123. A current or voltage sensor 130 may be provided to determine the level of power consumed by the utilization device, and control the source of cooling fluid 132 accordingly. For example, the cooling device 132 may not turn on until sufficient power has been consumed by the utilization device over a given period of time or, alternatively, the flow of air may be modulated with accordance with power consumed.

Once the cooling air is received within the utilization device, one or more apertures are provided for its escape such as at 108, creating a path over and/or past the component(s) most responsible for heat generation. In the case of the head-mounted lamp, the air will naturally pass over optional fins 106 surrounding a light source 104, and exit through the front of the assembly and away from the wearer, thereby minimizing the potential for overheating.

Note that passive cooling means may be used in conjunction with the invention, in the sense that the invention need not be responsible for all of the cooling of the utilization device, but rather, may be used in conjunction with passive cooling to simplify the passive cooling structure or to reduce size.

FIG. 2 illustrates an alternative embodiment of the invention wherein a computer peripheral device is cooled through an air carrying conduit 210 disposed in a path parallel to the signal-carrying cabling 212. Although a joystick 204 is shown, this is only used as an example of an application of the invention wherein the device remote from a different piece of equipment could benefit from active cooling without integrating a fan into the device directly. In this case, in the event that the equipment itself includes its own fan for cooling purposes and the device is factory installed, a portion of the same cooling air generated by the fan in the equipment may be forced through the cooling tube to cool the peripheral device. As an alternative, a separate air compressor may be used. In either case, ports such as 214 are preferably provided proximate to the components in need of cooling, enabling air flow 216 to pass thereover.

Figure 3:
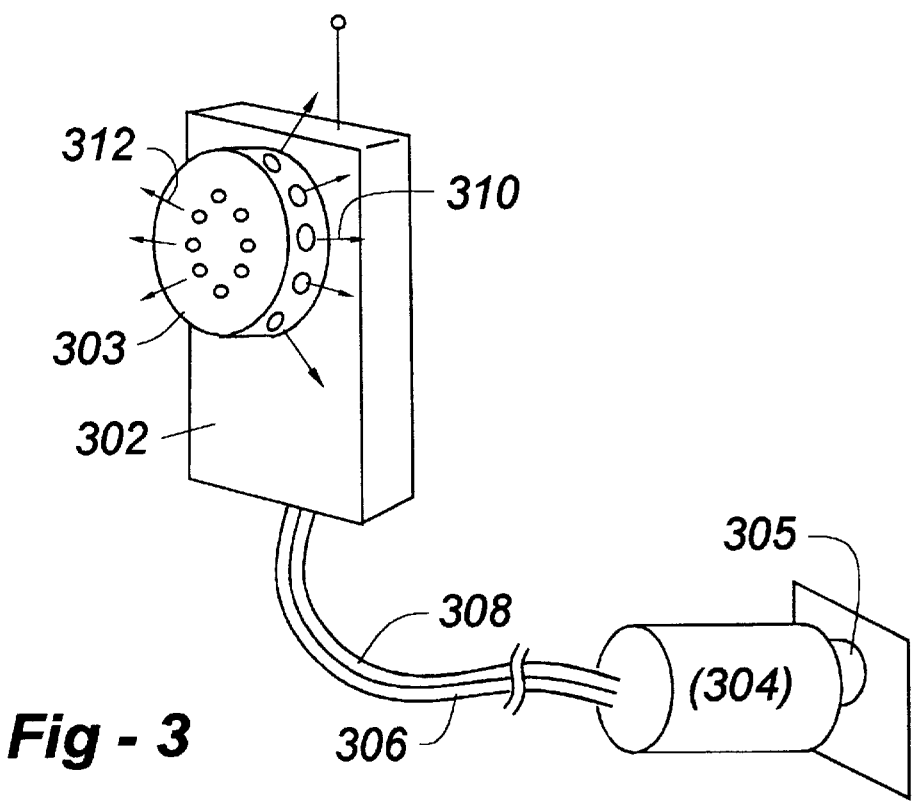
FIG. 3 is a drawing which shows how the invention may be adapted for use with a cellular telephone.

FIG. 3 illustrates a further embodiment of the invention adapted for use in conjunction with a hand-held telecommunications device, such as a cellular phone 302. Although such phones contain batteries enabling them to be physically self-sufficient, there are instances wherein they are tethered to a power source and used for prolonged periods of time, as in vehicles, where they may heat up to unacceptable levels. The present invention solves this problem by providing a combined power/air source 304 that may include a cigarette-lighter connector 305 to facilitate disconnection and removal. Alternatively, if the cabling is installed by the vehicle manufacturer or as an after-market integrated product, direct connection may be made inside of the vehicle hiding the air source while, optionally, carrying electrical signals between the phone and other parts of the vehicle to increase transmitting power, for example. In this case, the air flowing from the source to the phone through tubing 306 is intentionally directed to the earpiece 303, exiting at 310 and 312 through apertures provided for each purpose, since this is the portion of the device which makes contact with the user and often tends to create the most discomfort.

Although three particular applications of the invention have been disclosed, it will apparent to one of skill in the art that the principles set forth herein are equally applicable to many other situations, including apparatus which has yet to be encountered or developed. In general terms, the invention is applicable to any situation wherein power, either electrical or optical, delivered to a utilization device which could benefit from active, as opposed to passive cooling from a remotely disposed source.

In addition, as shown in FIG. 4, the invention is not limited to the use of air, but may also use any type of cooling fluid including other gases and even liquids. As shown in FIG. 4, a source of 422 is used to provide a generalized utilization device 454, and a recirculating cooling apparatus 432 is used to provide a cooling fluid along path 424, which surrounds the device 454 through a jacket 456, and is returned to the unit 432 through path 434, with the heat removed, using, for example, well-known refrigeration type processes. As in the case of FIG. 1, a sensor 430 of the power from 422 may be used to activate and/or control the degree of cooling provided through unit 432.

I claim:

1. Cooling apparatus, comprising:
    a power adapter, including:
        a source of electrical power, and
        a device for moving a fluid;
    a remote unit using at least a portion of the electrical power from the source; and
    an interconnection between the power adapter and the remote unit, interconnection including:
        electrical wiring to supply the power to the remote unit, and
        a path for the fluid to cool the remote unit.

2. The cooling apparatus of claim 1, wherein the fluid is air.

3. The cooling apparatus of claim 2, wherein the air is delivered to the remote unit and released at the location of the remote unit.

4. The cooling apparatus of claim 2, wherein the air is drawn through the remote unit and released at the location of the power adapter.

5. The cooling apparatus of claim 1, wherein the base unit further includes a power converter.

6. The cooling apparatus of claim 1, wherein the base unit forms part of a power supply.

7. The cooling apparatus of claim 1, wherein the remote unit includes a hand-held portion.

8. The cooling apparatus of claim 10, wherein the remote unit is a telephone.

9. The cooling apparatus of claim 1, wherein the device is a fan.

10. The cooling apparatus of claim 1, wherein the device is a pump.

11. The cooling apparatus of claim 1, wherein the electrical wiring and the path for the fluid are parallel to one another.

12. The cooling apparatus of claim 1, wherein the path for the fluid surrounds the electrical wiring.

13. The cooling apparatus of claim 1, further including coupling means for removably interconnecting the electrical wiring and the fluid path to the power adapter.

14. The cooling apparatus of claim 1, further including coupling means for removably interconnecting the electrical wiring and the fluid path to the remote unit.

15. The cooling apparatus of claim 1, wherein the device is a compressor.

16. Cooling apparatus, comprising:
a base unit, including:
   a power converter providing electrical power, and
   a device for moving a fluid;
a remote unit using at least a portion of the electrical power; and
an interconnection between the base unit and the remote unit, the interconnection including:
   electrical wiring to supply the power to the remote unit, and
   a path for the fluid to cool the remote unit.

17. The cooling apparatus of claim 16, wherein the fluid is air.

18. The cooling apparatus of claim 17, wherein the air is delivered to the remote unit released at the location of the remote unit.

19. The cooling apparatus of claim 17, wherein the air is drawn through the remote unit and released at the location of the base unit.

20. The cooling apparatus of claim 16, wherein the base unit forms part of a power supply.

21. The cooling apparatus of claim 16, wherein the remote unit includes a hand-held portion.

22. The cooling apparatus of claim 21, wherein the remote unit is a telephone.

23. The cooling apparatus of claim 16, wherein the device is a fan.

24. The cooling apparatus of claim 16, wherein the device is a pump.

25. The cooling apparatus of claim 16, wherein the electrical wiring and the path for the fluid are parallel to one another.

26. The cooling apparatus of claim 16, wherein the path for the fluid surrounds the electrical wiring.

27. The cooling apparatus of claim 16, further including coupling means for removably interconnecting the electrical wiring and the fluid path to the base unit.

28. The cooling apparatus of claim 16, further including coupling means for removably interconnecting the electrical wiring and the fluid path to the remote unit.

29. The cooling apparatus of claim 16, wherein the device is a compressor.

30. Cooling apparatus, comprising:
a base unit, including:
   a source of electrical power, and
   a device for moving a fluid;
a hand-held telephone using at least a portion of the electrical power from the source; and
an interconnection between the base unit and the telephone, the interconnection including:
   electrical wiring to supply the power to the remote unit, and
   a path for the fluid to cool the telephone.

31. The cooling apparatus of claim 30, wherein the fluid is air.

32. The cooling apparatus of claim 31, wherein the air is delivered to the telephone and released at the location of the telephone.

33. The cooling apparatus of claim 31, wherein the air is drawn through the telephone and released at the location of the base unit.

34. The cooling apparatus of claim 30, wherein the base unit further includes a power converter.

35. The cooling apparatus of claim 30, wherein the base unit forms part of a power supply.

36. The cooling apparatus of claim 30, wherein the device is a fan.

37. The cooling apparatus of claim 30, wherein the device is a pump.

38. The cooling apparatus of claim 30, wherein the electrical wiring and the path for the fluid are parallel to one another.

39. The cooling apparatus of claim 30, wherein the path for the fluid surrounds the electrical wiring.

40. The cooling apparatus of claim 30, further including coupling means for removably interconnecting the electrical wiring and the fluid path to the base unit.

41. The cooling apparatus of claim 30, further including coupling means for removably interconnecting the electrical wiring and the fluid path to the telephone.

42. The cooling apparatus of claim 30, wherein the device is a compressor.

\* \* \* \* \*